US012811563B2

(12) United States Patent
Omura

(10) Patent No.: US 12,811,563 B2
(45) Date of Patent: Nov. 24, 2026

(54) ACOUSTIC WAVE DEVICE

(71) Applicant: Murata Manufacturing Co., Ltd., Nagaokakyo (JP)

(72) Inventor: Masashi Omura, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 523 days.

(21) Appl. No.: 18/537,870

(22) Filed: Dec. 13, 2023

(65) Prior Publication Data

US 2024/0113683 A1 Apr. 4, 2024

Related U.S. Application Data

(63) Continuation of application No. PCT/JP2022/033138, filed on Sep. 2, 2022.

(30) Foreign Application Priority Data

Sep. 6, 2021 (JP) ................................ 2021-144885

(51) Int. Cl.
*H03H 9/17* (2006.01)
*H03H 9/13* (2006.01)

(52) U.S. Cl.
CPC ............. *H03H 9/17* (2013.01); *H03H 9/131* (2013.01)

(58) Field of Classification Search
CPC .... H03H 9/17; H03H 9/131; H03H 2003/021; H03H 2003/0407; H03H 9/132; H03H 9/02102; H03H 3/02; H03H 9/173
See application file for complete search history.

(56) References Cited

U.S. PATENT DOCUMENTS 5,910,699 A * 6/1999 Namba .................... H03H 9/19 310/346
2012/0205754 A1 8/2012 Iwamoto
(Continued)

FOREIGN PATENT DOCUMENTS

JP 2010200197 A 9/2010
JP 2016086308 A 5/2016
(Continued)

OTHER PUBLICATIONS

International Search Report in PCT/JP2022/033138, mailed Nov. 22, 2022, 3 pages.
(Continued)

*Primary Examiner* — Bumsuk Won
(74) *Attorney, Agent, or Firm* — Keating & Bennett, LLP

(57) ABSTRACT

An acoustic wave device includes a support, a piezoelectric layer with an anisotropic coefficient of linear expansion, and including first and second main surfaces, at least one through-hole, a first electrode in or on the first main surface, and a second electrode in or on the second main surface and opposed to the first electrode. A cavity is provided in the support. At least a portion of the first and second electrodes overlaps the cavity in plan view. In plan view, the at least one through-hole is line symmetric about an axis of symmetry that passes a center of the cavity in a region where the first and second electrodes overlap each other and that extends in a direction in which the coefficient of linear expansion of the piezoelectric layer is greatest.

17 Claims, 9 Drawing Sheets

(56) References Cited

U.S. PATENT DOCUMENTS

| | | | | |
|---|---|---|---|---|
| 2014/0159544 | A1* | 6/2014 | Abe | H03H 9/1092 277/628 |
| 2015/0325775 | A1* | 11/2015 | Shimizu | H10N 30/871 29/25.35 |
| 2016/0099701 | A1* | 4/2016 | Rinaldi | G01J 3/42 422/90 |
| 2017/0288122 | A1* | 10/2017 | Zou | H03H 9/175 |
| 2017/0353173 | A1* | 12/2017 | Sakurai | H03H 9/059 |
| 2018/0145655 | A1 | 5/2018 | Tsutsumi et al. | |
| 2019/0007024 | A1* | 1/2019 | Broekaart | H03H 9/02834 |
| 2020/0091886 | A1 | 3/2020 | Matsuo | |

FOREIGN PATENT DOCUMENTS

| | | | |
|---|---|---|---|
| JP | 2018085651 | A | 5/2018 |
| JP | 2020048193 | A | 3/2020 |
| WO | 2011052551 | A1 | 5/2011 |

OTHER PUBLICATIONS

Written Opinion in PCT/JP2022/033138, mailed Nov. 22, 2022, 3 pages.

* cited by examiner

ACOUSTIC WAVE DEVICE

CROSS REFERENCE TO RELATED APPLICATIONS

This application claims the benefit of priority to Japanese Patent Application No. 2021-144885 filed on Sep. 6, 2021 and is a Continuation Application of PCT Application No. PCT/JP2022/033138 filed on Sep. 2, 2022. The entire contents of each application are hereby incorporated herein by reference.

BACKGROUND OF THE INVENTION

1. Field of the Invention

The present disclosure relates to acoustic wave devices.

2. Description of the Related Art

Heretofore, acoustic wave devices have been widely used for filters of mobile phones and the like. Japanese Unexamined Patent Application Publication No. 2020-048193 discloses a thin film bulk acoustic wave resonator as an example of the acoustic wave devices. In this acoustic wave device, a piezoelectric material is suspended over a cavity. A top electrode is provided on one main surface of the piezoelectric material, and a bottom electrode is provided on the opposite main surface. A plurality of apertures are provided in the piezoelectric material. The apertures are provided to remove a sacrificial material from the cavity in the manufacturing process of the acoustic wave device.

Here, when the coefficient of linear expansion of the piezoelectric material is anisotropic, providing hole portions, such as the apertures, in the piezoelectric material makes the piezoelectric material prone to torsional deformation by a temperature change or the like. Alternatively, when groove portions for reflecting acoustic waves are provided in the piezoelectric material, the piezoelectric material may also experience torsional deformation. In these cases, electrical characteristics of the acoustic wave device may be deteriorated.

SUMMARY OF THE INVENTION

Preferred embodiments of the present invention provide acoustic wave devices each including a piezoelectric layer resistant to torsional deformation.

An acoustic wave device according to a preferred embodiment of the present invention includes a support, a piezoelectric layer on the support, with a coefficient of linear expansion that is anisotropic, and including a first main surface and a second main surface opposed to each other, and at least one hole is provided, a first electrode in or on the first main surface of the piezoelectric layer, and a second electrode in or on the second main surface and opposed to the first electrode. A cavity is provided in the support, at least a portion of the first electrode and the second electrode overlaps the cavity portion in plan view, and in plan view, the at least one hole portion is line symmetric about an axis of symmetry that passes a center of the cavity portion in a region where the first electrode and the second electrode overlap each other and that extends in a direction in which the coefficient of linear expansion of the piezoelectric layer is greatest.

With the acoustic wave devices according to preferred embodiments of the present invention, it is possible to provide acoustic wave devices each with a piezoelectric layer resistant to torsional deformation.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be clarified below by describing preferred embodiments of the present invention with reference to the drawings.

Each preferred embodiment described herein is illustrative, and configurations can be partially replaced or combined between different preferred embodiments.

Figure 1:
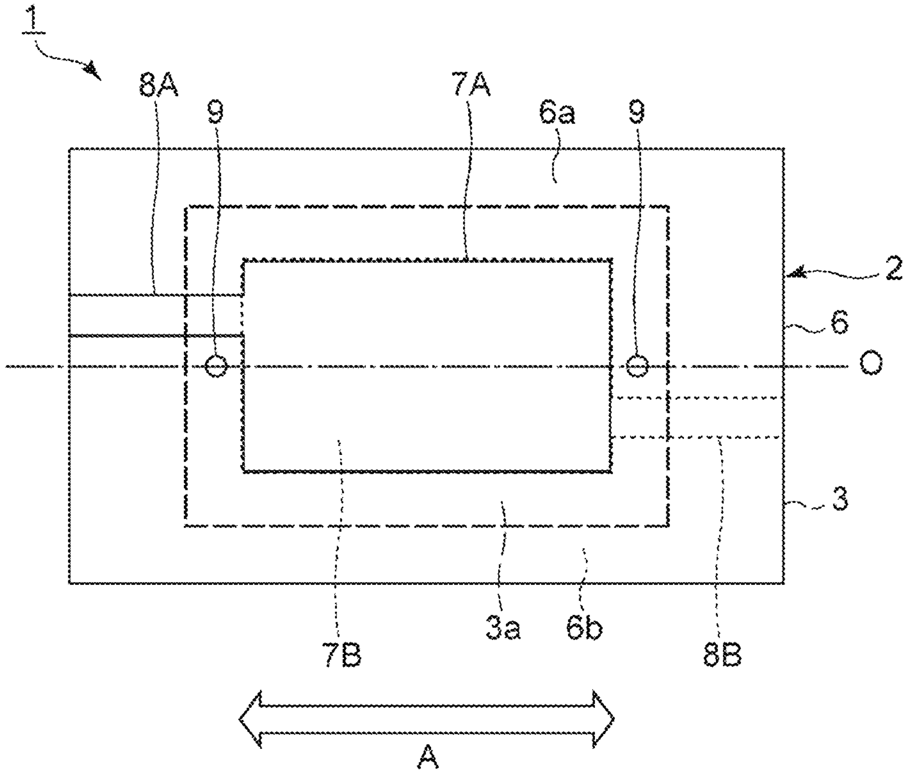
FIG. 1 is a plan view of an acoustic wave device according to a first preferred embodiment of the present invention.
Figure 2:
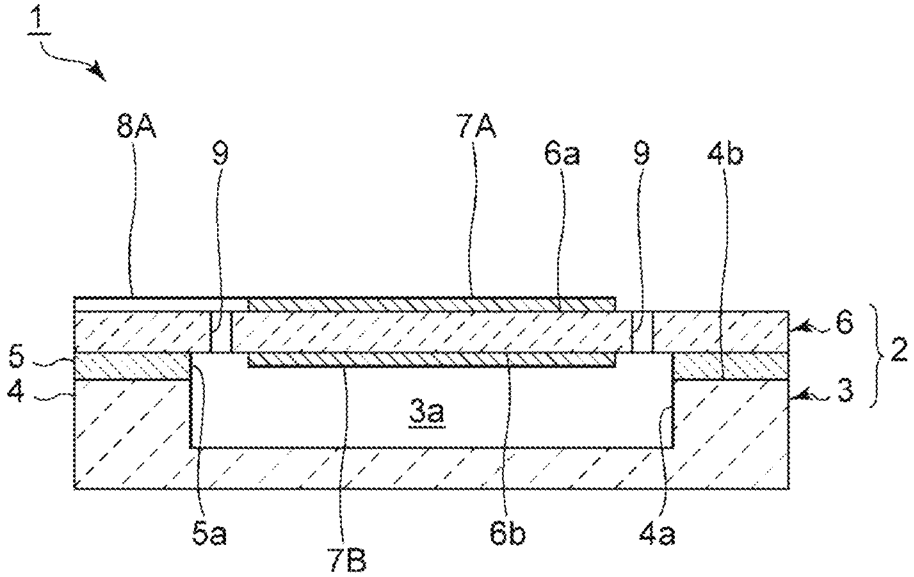
FIG. 2 is an elevational sectional view of the acoustic wave device according to the first preferred embodiment of the present invention.

FIG. 1 is a plan view of an acoustic wave device according to a first preferred embodiment of the present invention. FIG. 2 is an elevational sectional view of the acoustic wave device according to the first preferred embodiment. FIG. 2 is a sectional view of the acoustic wave device taken along an axis of symmetry to be described later.

An acoustic wave device 1 illustrated in FIG. 1 is a BAW (Bulk Acoustic Wave) element, for example. Specifically, the acoustic wave device 1 includes a piezoelectric substrate 2. As illustrated in FIG. 2, the piezoelectric substrate 2 includes a support 3 and a piezoelectric layer 6. The piezoelectric layer 6 is provided on the support 3. The piezoelectric layer 6 includes a first main surface 6*a* and a second main surface 6*b*. The first main surface 6*a* and the second main surface 6*b* are opposed to each other. Of the first main surface 6*a* and the second main surface 6*b*, the second main surface 6*b* is the main surface on the support 3 side.

The coefficient of linear expansion of the piezoelectric layer 6 is anisotropic. A double-headed arrow A in FIG. 1 indicates the direction in which the coefficient of linear expansion of the piezoelectric layer 6 is greatest. As the material of the piezoelectric layer 6, it is possible to use, for example, lithium niobate, lithium tantalate, or the like.

As illustrated in FIG. 2, the support 3 includes a support substrate 4 and a joint layer 5.

The joint layer 5 is provided on the support substrate 4. The piezoelectric layer 6 is provided on the joint layer 5. More specifically, the support substrate 4 includes a recessed portion 4*a* and a support portion 4*b*. The support portion 4*b* surrounds the recessed portion 4*a*. The joint layer 5 is provided on the support portion 4*b*. The joint layer 5 has a frame shape. More specifically, the joint layer 5 includes a cavity 5*a*. The recessed portion 4*a* of the support substrate 4 and the cavity 5*a* of the joint layer 5 define a cavity portion 3*a* of the support 3. The cavity portion 3*a* of the support 3 is therefore open on the piezoelectric layer 6 side. The piezoelectric layer 6 is provided so as to close the cavity portion 3*a*.

As the material of the support substrate 4, it is possible to use, for example, a piezoelectric material such as aluminum oxide, lithium tantalate, lithium niobate, or quartz; any of various ceramics such as alumina, sapphire, silicon nitride, aluminum nitride, silicon carbide, zirconia, cordierite, mullite, steatite, and forsterite; a dielectric such as diamond or glass; a semiconductor such as gallium nitride; a resin; or the like.

As the material of the joint layer 5, it is possible to use, for example, silicon oxide, silicon nitride, tantalum oxide, or the like. The joint layer 5 does not necessarily have to be provided. The support 3 may include only the support substrate 4.

A first electrode 7A is provided on the first main surface 6*a* of the piezoelectric layer 6. A second electrode 7B is provided on the second main surface 6*b*. The first electrode 7A and the second electrode 7B are opposed to each other with the piezoelectric layer 6 therebetween. The entirety or substantially an entirety of the first electrode 7A and the entirety or substantially the entirety of the second electrode 7B overlap the cavity portion 3*a* of the support 3 in plan view. Here, it suffices that at least a portion of the first electrode 7A and the second electrode 7B overlaps the cavity portion 3*a* in plan view. In this description, "plan view" refers the direction of a view from the upper side in FIG. 2.

A portion where the first electrode 7A and the second electrode 7B overlap each other in plan view is an excitation region. An acoustic wave is excited at the excitation region. The excitation region has a rectangular or substantially rectangular shape in plan view. The excitation region therefore has a longitudinal direction and a transverse direction. More specifically, in the present preferred embodiment, the longitudinal direction of the excitation region is the long-side direction, and the transverse direction is the short-side direction. The shape of the excitation region, however, is not limited to the above.

As illustrated in FIG. 1, a first extended wiring line 8A is provided on the first main surface 6*a* of the piezoelectric layer 6. The first extended wiring line 8A is connected to the first electrode 7A. A second extended wiring line 8B is provided on the second main surface 6*b*. The second extended wiring line 8B is connected to the second electrode 7B. The first extended wiring line 8A and the second extended wiring line 8B are connected to different potentials.

A pair of hole portions are provided in the piezoelectric layer 6. In the present preferred embodiment, the hole portions are through-holes 9. The hole portions do not necessarily have to pass through the piezoelectric layer 6. In addition, it suffices that at least one hole portion is provided. In the present preferred embodiment, the pair of through-holes 9 are used to remove a sacrificial layer to define the cavity portion 3*a* when the acoustic wave device 1 is manufactured. The pair of through-holes 9 are opposed to each other with the first electrode 7A and the second electrode 7B therebetween in plan view. The shapes and areas of the pair of through-holes 9 are the same or substantially the same in plan view. More specifically, the shapes of the pair of through-holes 9 in plan view are each circular or substantially circular, for example. The shapes of the through-holes 9, however, are not limited to the above.

The present preferred embodiment has the following configuration. Specifically, in plan view, each through-hole 9 is line symmetric about an axis of symmetry O defined as an axis that passes the center of the cavity portion 3*a* in the region where the first electrode 7A and the second electrode 7B overlap each other and that extends in the direction in which the coefficient of linear expansion of the piezoelectric layer 6 is greatest. Wherein, the center of the cavity means center of gravity of the cavity. More specifically, in the acoustic wave device 1, each through-hole 9 is on the axis of symmetry O and has a shape that is line symmetric about the axis of symmetry O. When folded back by the axis of symmetry O, at least a portion of the through-holes 9 overlap each other. This improves the evenness of the thermal expansion of the piezoelectric layer 6 when the temperature changes. Accordingly, the piezoelectric layer 6 is resistant to torsional deformation.

The following shows and describes a non-limiting example of a method of manufacturing the acoustic wave device according to the present preferred embodiment.

FIGS. 3A to 3E are elevational sectional views for describing a non-limiting example of the method of manufacturing the acoustic wave device according to the first preferred embodiment.

Figure 3A:
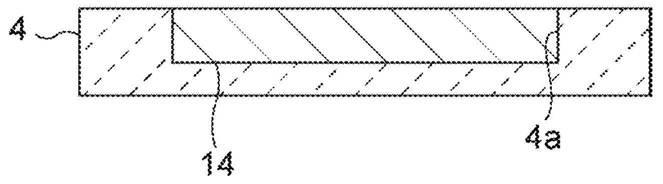
FIGS. 3A to 3E are elevational sectional views for describing a non-limiting example of a method of manufacturing the acoustic wave device according to the first preferred embodiment of the present invention.

As illustrated in FIG. 3A, the recessed portion 4*a* is provided in the support substrate 4. The recessed portion 4*a* can be provided by, for example, dry etching or the like. Then, a sacrificial layer 14 is provided in the recessed portion 4*a* of the support substrate 4. The provision of the sacrificial layer 14 can be followed by polishing or the like to make the surface of the support substrate 4 and the surface of the sacrificial layer 14 flush.

Figure 3B:
Figure 3C:
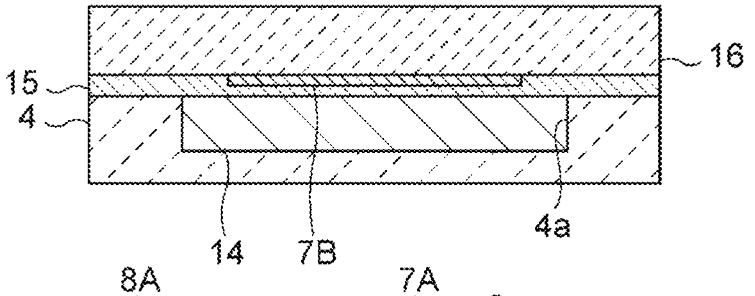

Meanwhile, as illustrated in FIG. 3B, the second electrode 7B is provided on one main surface of a piezoelectric substrate 16. The second electrode 7B can be provided by, for example, sputtering, vacuum deposition, or the like. The second extended wiring line 8B is also provided on the one main surface described above simultaneously with the second electrode 7B. Then, as illustrated in FIG. 3C, a joint layer 15 is provided on the support substrate 4. The joint layer 15 can be provided by, for example, sputtering, vacuum deposition, or the like. Then, the piezoelectric substrate 16 is joined to the support substrate 4 with the joint layer 15. At this time, the piezoelectric substrate 16 and the support substrate 4 are joined such that the second electrode 7B is positioned between the piezoelectric substrate 16 and the sacrificial layer 14.

Figure 3D:
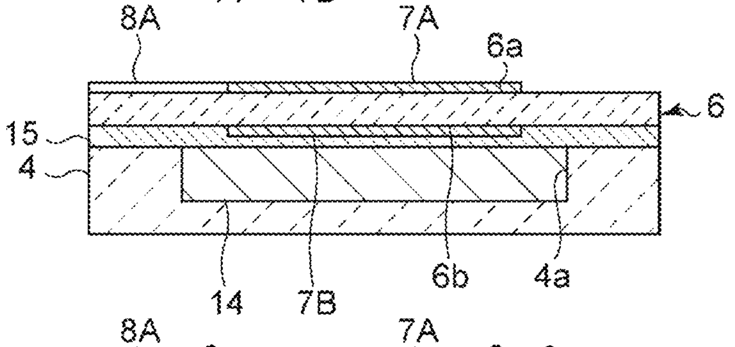

Then, the piezoelectric substrate 16 is thinned by, for example, polishing of the main surface of the piezoelectric substrate 16 on which the second electrode 7B is not provided. Ion slicing or the like, for example, may be used to thin the piezoelectric substrate 16. As a result, the piezoelectric layer 6 is obtained, as illustrated in FIG. 3D. Then, the first electrode 7A is provided on the first main surface 6*a* of the piezoelectric layer 6. The first electrode 7A can be provided by, for example, sputtering, vacuum deposition, or the like. The first extended wiring line 8A is also provided on the first main surface 6*a* simultaneously with the first electrode 7A.

Figure 3E:
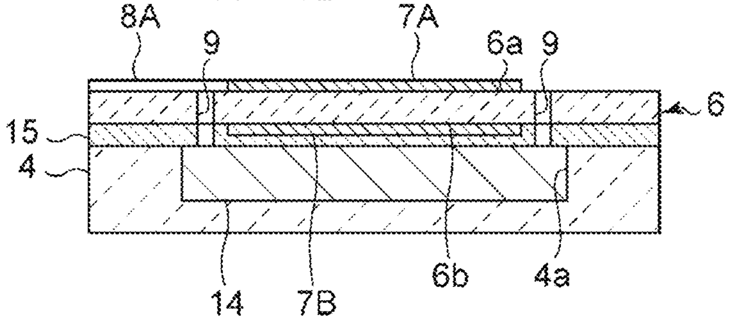

Then, as illustrated in FIG. 3E, the pair of through-holes 9 are provided in the piezoelectric layer 6 and the joint layer 15 so as to extend to the sacrificial layer 14. At this time, in plan view, the pair of through-holes 9 are line symmetric about an axis of symmetry defined as an axis passing the center of the recessed portion 4*a* of the support substrate 4 and extending in the direction in which the coefficient of linear expansion of the piezoelectric layer 6 is greatest. Then, an etchant is caused to flow in from the through-holes 9 to remove the sacrificial layer 14 and the portion of the joint layer 15 facing the recessed portion 4*a* of the support substrate 4. As a result, the cavity portion 3*a* illustrated in FIG. 2 is formed.

Figure 4:
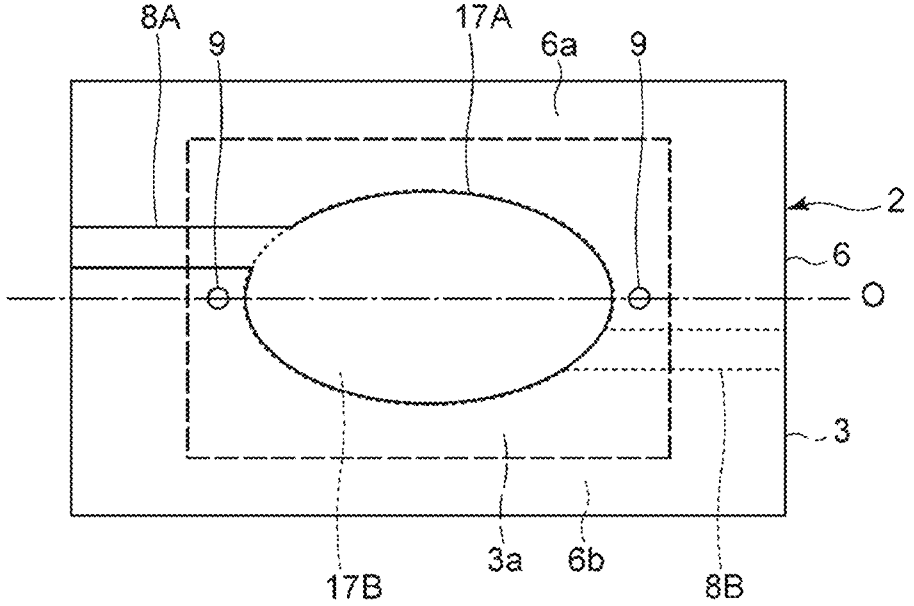
FIG. 4 is a plan view of an acoustic wave device according to a first modification of the first preferred embodiment of the present invention.

As illustrated in FIG. 1, in the acoustic wave device 1, the shapes of the first electrode 7A and the second electrode 7B are rectangular or substantially rectangular in plan view. The shapes of the first electrode 7A and the second electrode 7B, however, are not limited to the above. For example, in a first modification of the first preferred embodiment illustrated in FIG. 4, the shapes of a first electrode 17A and a second electrode 17B are elliptical or substantially elliptical in plan view.

In the acoustic wave device 1, the through-holes 9 are disposed on the axis of symmetry O. However, the through-holes 9 do not necessarily have to be disposed on the axis of symmetry O. For example, in a second modification of the first preferred embodiment illustrated in FIG. 5, the pair of through-holes 9 are not provided on the axis of symmetry O. The pair of through-holes 9 are opposed to each other in a direction perpendicular or substantially perpendicular to the axis of symmetry O with the first electrode 17A and the second electrode 17B in between in plan view. The shapes and sizes of the pair of through-holes 9 are the same or substantially the same in plan view. The pair of through-holes 9 are line symmetric about the axis of symmetry O. The first electrode 17A and the second electrode 17B in the present modification are formed similarly to those in the first modification.

Figure 6:
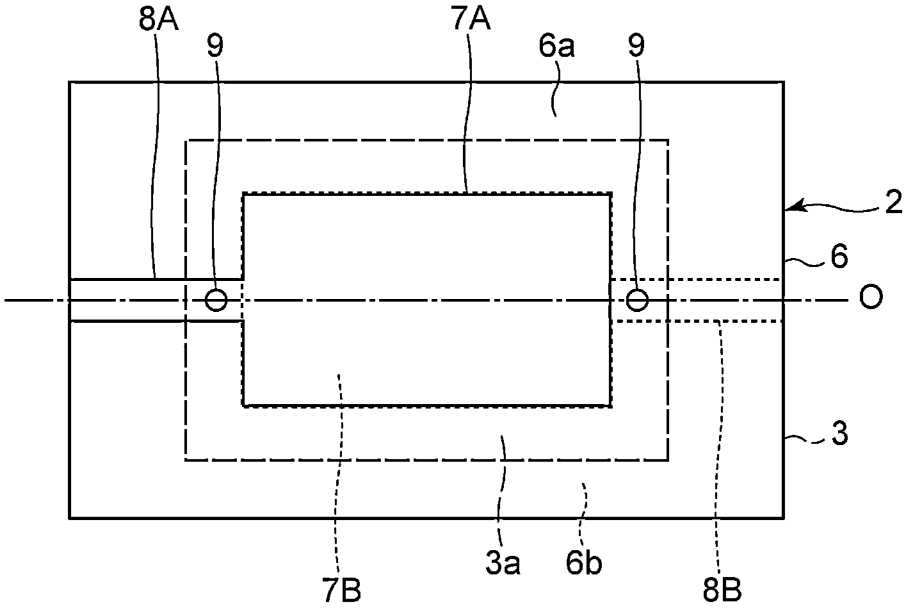
FIG. 6 is a plan view of an acoustic wave device according to a third modification of the first preferred embodiment of the present invention.

As illustrated in FIG. 1, the first extended wiring line 8A and the second extended wiring line 8B are provided at positions spaced away from the through-holes 9. Thus, the through-holes 9 do not pass through the first extended wiring line 8A and the second extended wiring line 8B. However, the positional relationship between the through-holes 9 and the first extended wiring line 8A and second extended wiring line 8B is not limited to the above. For example, in a third modification of the first preferred embodiment illustrated in FIG. 6, at least a portion of the first extended wiring line 8A and the second extended wiring line 8B and the pair of through-holes 9 are disposed on the axis of symmetry O in plan view. One of the pair of through-holes 9 passes through the first extended wiring line 8A. The other of the pair of through-holes 9 passes through the second extended wiring line 8B.

Figure 7:
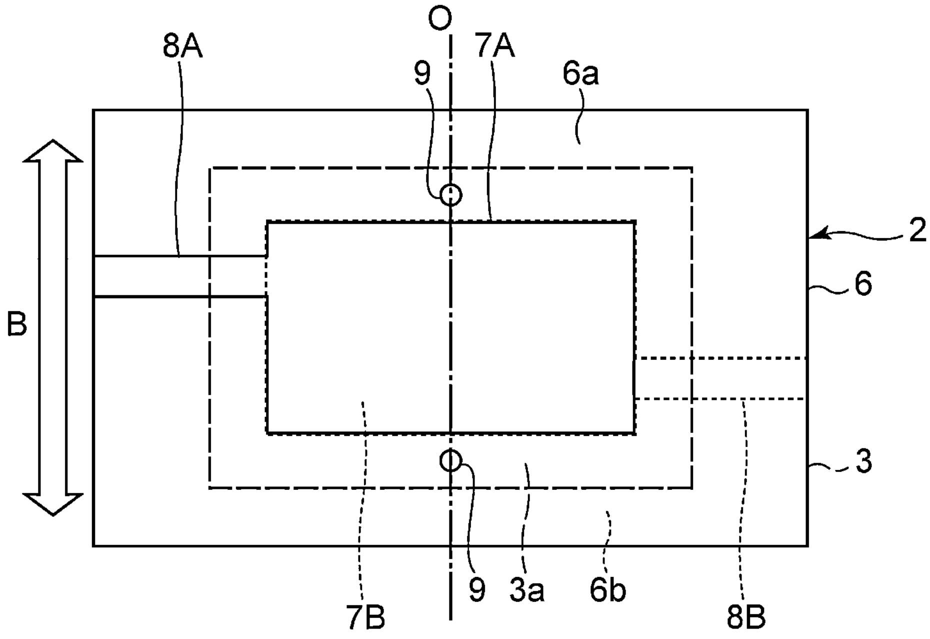
FIG. 7 is a plan view of an acoustic wave device according to a fourth modification of the first preferred embodiment of the present invention.
Figure 8:
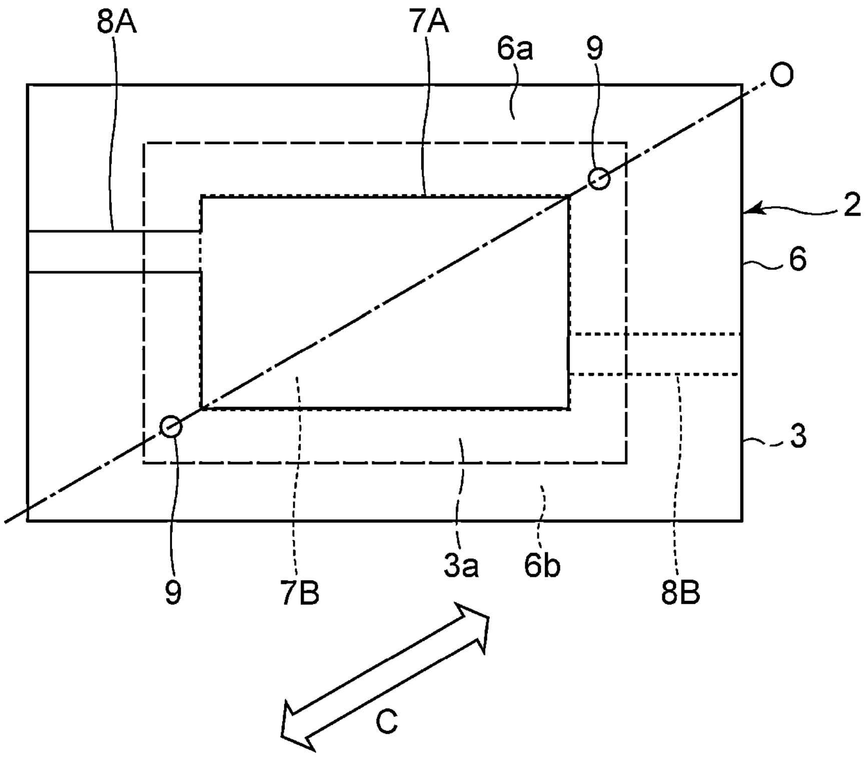
FIG. 8 is a plan view of an acoustic wave device according to a fifth modification of the first preferred embodiment of the present invention.

Also, in the present preferred embodiment, the axis of symmetry O of the piezoelectric layer 6 extends in parallel or substantially in parallel to the long-side direction of the excitation region. The direction of the axis of symmetry O, however, is not limited to the above. For example, in a fourth modification of the first preferred embodiment illustrated in FIG. 7, the coefficient of linear expansion of the piezoelectric layer 6 is greatest in the direction parallel or substantially parallel to the short-side direction of the excitation region, as indicated by a double-headed arrow B. Thus, the axis of symmetry O extends in parallel or substantially in parallel to the short-side direction of the excitation region. The pair of through-holes 9 are disposed on the axis of symmetry O. In a fifth modification of the first preferred embodiment illustrated in FIG. 8, the coefficient of linear expansion of the piezoelectric layer 6 is greatest in a direction crossing both the long-side direction and the short-side direction of the excitation region, as indicated by a double-headed arrow C. Thus, the axis of symmetry O extends in the direction crossing both the long-side direction and the short-side direction of the excitation region. The pair of through-holes 9 are disposed on the axis of symmetry O. In the above first to fifth modification as well, the piezoelectric layer 6 is resistant to torsional deformation as in the first preferred embodiment.

Figure 9:
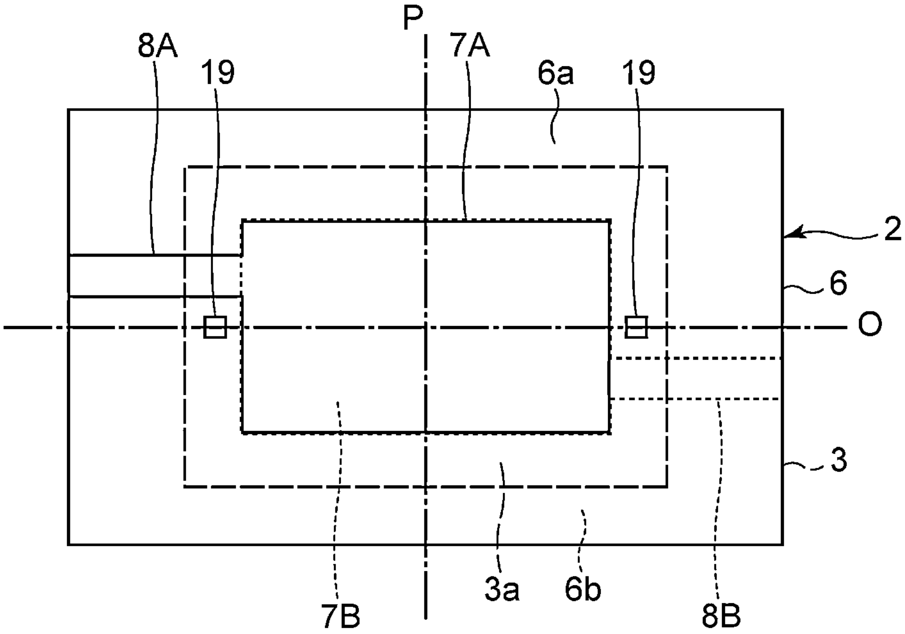
FIG. 9 is a plan view of an acoustic wave device according to a sixth modification of the first preferred embodiment of the present invention.

As described above, the shapes of the pair of through-holes 9 in plan view are circular or substantially circular. However, the shapes of the through-holes 9 are not limited to the above. For example, in a sixth modification of the first preferred embodiment illustrated in FIG. 9, the shapes of a pair of through-holes 19 in plan view are each square or substantially square. The areas of the pair of through-holes 19 are the same or substantially the same in plan view. The pair of through-holes 19 are each disposed to be line symmetric about the axis of symmetry O. Meanwhile, an axis P illustrated in FIG. 9 is an axis extending in a direction passing the center of the cavity portion 3*a* of the support 3 and perpendicularly or substantially perpendicularly crossing the axis of symmetry O in plan view. The pair of through-holes 19 are also line symmetric about this axis P. This makes the piezoelectric layer 6 more resistant to torsional deformation. Although not illustrating in FIG. 1 or the like, in the first preferred embodiment and the first to fifth modifications as well, the pair of through-holes 9 are disposed to be line symmetric about an axis corresponding to the axis P.

Figure 10:
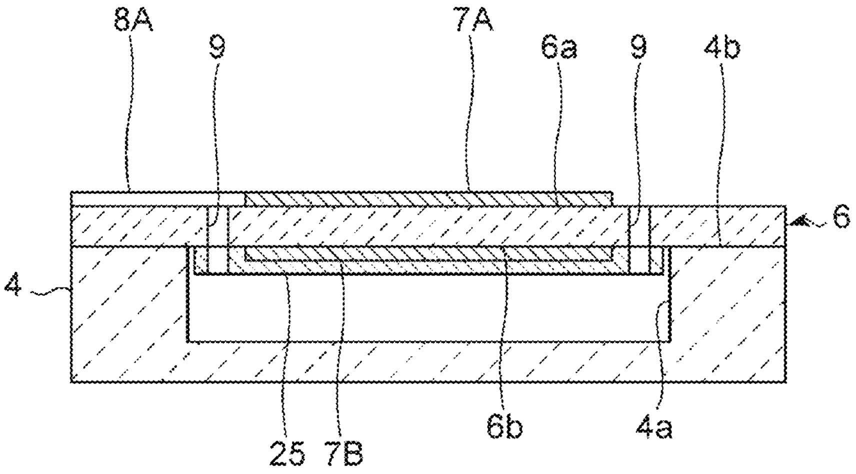
FIG. 10 is an elevational sectional view of an acoustic wave device according to a second preferred embodiment of the present invention.

FIG. 10 is an elevational sectional view of an acoustic wave device according to a second preferred embodiment of the present invention.

The present preferred embodiment differs from the first preferred embodiment in that the support substrate 4 and the piezoelectric layer 6 are directly joined to each other, a dielectric film 25 is provided on the second main surface 6*b* of the piezoelectric layer 6, and the through-holes 9 pass through the piezoelectric layer 6 and the dielectric film 25. Other than the above points, the configuration of the acoustic wave device according to the present preferred embodiment is the same as or similar to that of the acoustic wave device 1 according to the first preferred embodiment. As the material of the dielectric film 25, it is possible to use, for example, silicon oxide, silicon nitride, tantalum oxide, or the like.

The dielectric film 25 is provided on the second main surface 6*b* of the piezoelectric layer 6 so as to cover the second electrode 7B. Accordingly, the second electrode 7B does not break easily. The dielectric film 25 may be provided on the first main surface 6*a* so as to cover the first electrode 7A. When the dielectric film 25 is provided on the first main surface 6*a* as well, the through-holes 9 may pass through the dielectric film 25. Alternatively, the dielectric film 25 may be provided on each of the first main surface 6*a* and the second main surface 6*b*. In this case, one of the dielectric films 25 may cover the first electrode 7A, and the other of the dielectric films 25 may cover the second electrode 7B.

In the present preferred embodiment as well, the through-holes 9 are line symmetric about the axis of symmetry O. This makes the piezoelectric layer 6 resistant to torsional deformation.

The support substrate 4 and the piezoelectric layer 6 may be joined by a joint layer as in the first preferred embodiment. In this case, the dielectric film 25 provided on the second main surface 6*b* of the piezoelectric layer 6 may be provided integrally with the joint layer.

Figure 11:
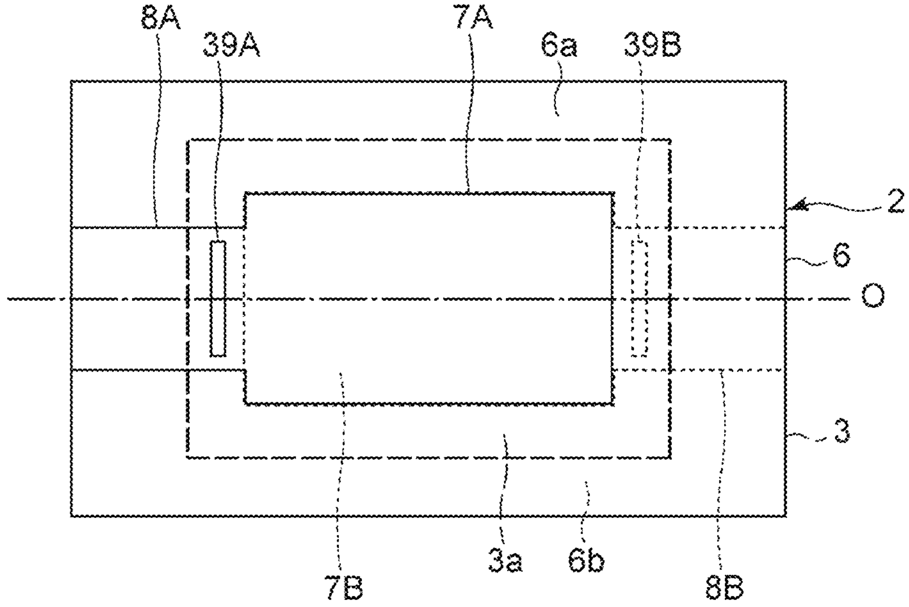
FIG. 11 is a plan view of an acoustic wave device according to a third preferred embodiment of the present invention.
Figure 12:
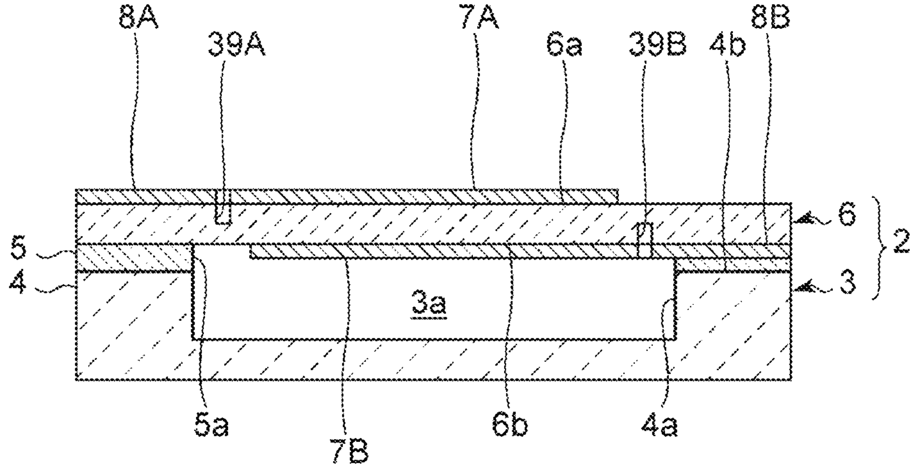
FIG. 12 is an elevational sectional view of the acoustic wave device according to the third preferred embodiment of the present invention.

FIG. 11 is a plan view of an acoustic wave device according to a third preferred embodiment of the present invention. FIG. 12 is an elevational sectional view of the acoustic wave device according to the third preferred embodiment.

As illustrated in FIG. 11, the present preferred embodiment differs from the first preferred embodiment in that the pair of hole portions pass through the first extended wiring line 8A and the second extended wiring line 8B, and the pair of hole portions are defined by a pair of groove portions 39A and 39B.

Other than the above points, the configuration of the acoustic wave device according to the present preferred embodiment is the same as or similar to that in the first preferred embodiment.

Of the pair of groove portions, one groove portion 39A is provided in the first main surface 6*a* of the piezoelectric layer 6. The shape of the groove portion 39A is rectangular or substantially rectangular in plan view. More specifically, the groove portion 39A has a slit shape. In the present preferred embodiment, the groove portion 39A is provided adjacently to a portion of the outer peripheral edge of the excitation region corresponding to the short side thereof. The groove portion 39A extends in parallel or substantially in parallel to the short-side direction of the excitation region.

As illustrated in FIG. 12, of the pair of groove portions, the other groove portion 39B is provided in the second main surface 6*b* of the piezoelectric layer 6. The shape and area of the groove portion 39B are the same or substantially the same as those of the groove portion 39A in plan view. In the present preferred embodiment, the depths of the groove portion 39A and the groove portion 39B are the same or substantially the same. The depths of the groove portion 39A and the groove portion 39B are dimensions of the groove portions in the thickness direction of the piezoelectric layer 6.

With the groove portion 39A and the groove portion 39B, acoustic waves leaking outward from the excitation region can be reflected toward the excitation region. This improves the energy efficiency. Also, in the present preferred embodiment as well, the groove portion 39A and the groove portion 39B as a pair of hole portions are line symmetric about the axis of symmetry O. This makes the piezoelectric layer 6 resistant to torsional deformation.

When the acoustic wave device according to the present preferred embodiment is manufactured, the support substrate 4 and the piezoelectric layer 6 may be provided individually and then the support substrate 4 and the piezoelectric layer 6 may be joined with the joint layer 5.

Figure 13:
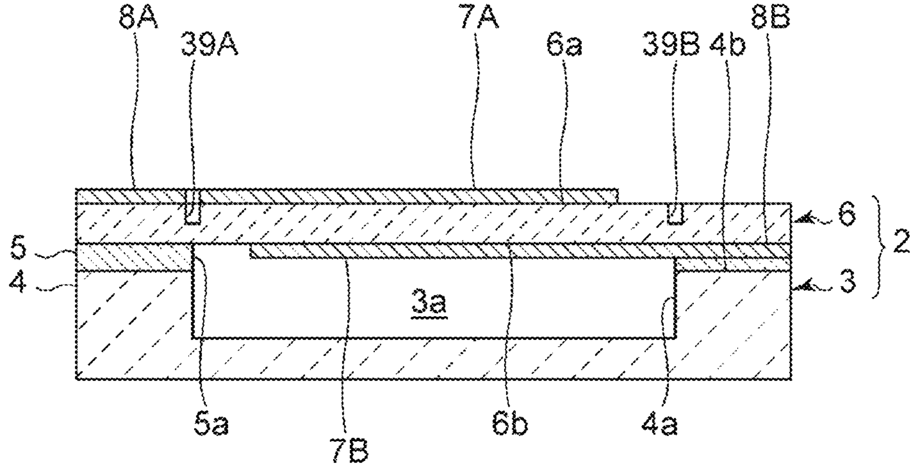
FIG. 13 is an elevational sectional view of an acoustic wave device according to a modification of the third preferred embodiment of the present invention.

The groove portion 39A and the groove portion 39B may both be provided in the same one of the first main surface 6*a* and the second main surface 6*b* of the piezoelectric layer 6. For example, in a modification of the third preferred embodiment illustrated in FIG. 13, the pair of groove portions 39A and 39B are provided in the first main surface 6*a*. Moreover, the groove portion 39A and the groove portion 39B overlap the boundary between the recessed portion 4*a* and the support portion 4*b* of the support substrate 4 in plan view. More specifically, in plan view, a portion of the groove portion 39A overlaps the cavity portion 3*a* of the support 3 while another portion thereof overlaps an outer side portion of the cavity portion 3*a*. This applies to the groove portion 39B as well. As described above, a portion of at least one of the pair of groove portions 39A and 39B may be positioned outside the cavity portion 3*a* in plan view. In this case as well, acoustic waves can be reflected toward the excitation region, and the piezoelectric layer 6 is resistant to torsional deformation.

Figure 14:
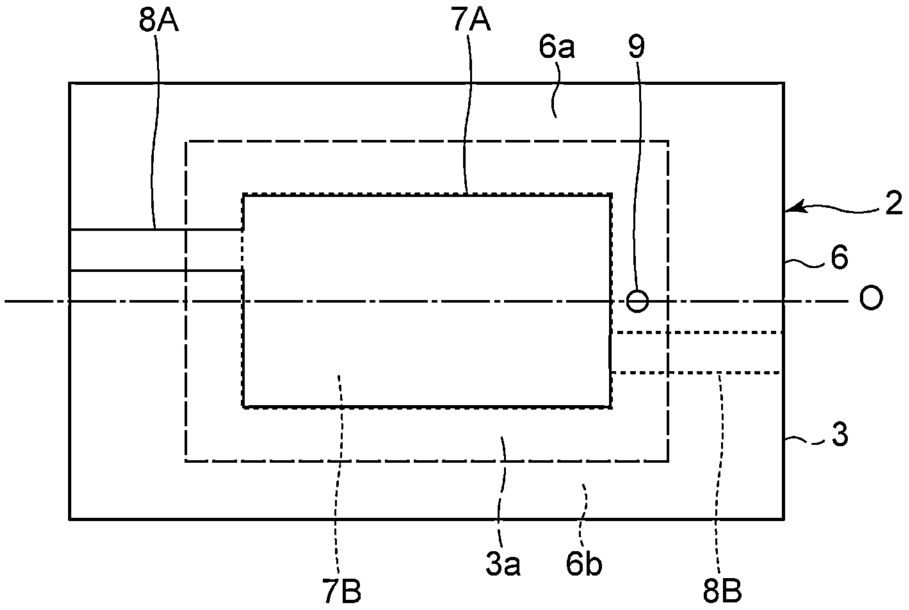
FIG. 14 is a plan view of an acoustic wave device according to a fourth preferred embodiment of the present invention.

FIG. 14 is a plan view of an acoustic wave device according to a fourth preferred embodiment of the present invention.

The present preferred embodiment differs from the first preferred embodiment in that only one hole portion is provided in the piezoelectric layer 6. Other than the above point, the configuration of the acoustic wave device according to the present preferred embodiment is the same as or similar to that of the acoustic wave device 1 according to the first preferred embodiment. The hole portion in the present preferred embodiment is a through-hole 9.

The through-hole 9 is on the axis of symmetry O and has a shape that is line symmetric about the axis of symmetry O. This improves the evenness of the thermal expansion of the piezoelectric layer 6 when the temperature changes. Accordingly, the piezoelectric layer 6 is resistant to torsional deformation.

In the first to fourth preferred embodiments and the modifications thereof, one or a pair of hole portions are provided in the piezoelectric layer 6. Moreover, the one or pair of hole portions are line symmetric about the axis of symmetry O. More specifically, in the first preferred embodiment illustrated in FIG. 1, a pair of hole portions are provided. In the first preferred embodiment, each hole portion is disposed to be line symmetric about the axis of symmetry O. However, the pair of hole portions are not line symmetric with respect to each other about the axis of symmetry O.

In the first preferred embodiment, the pair of hole portions can be divided into two groups. Here, a group means a group to which one hole portion or a pair of hole portions symmetric about the axis of symmetry O are included. In the first preferred embodiment, one of the pair of hole portions is included in one group while the other thereof is included the other group. Hole portions in different groups are not line symmetric with respect to each other about the axis of symmetry O. In the first preferred embodiment, the number of hole portion groups is two.

Figure 5:
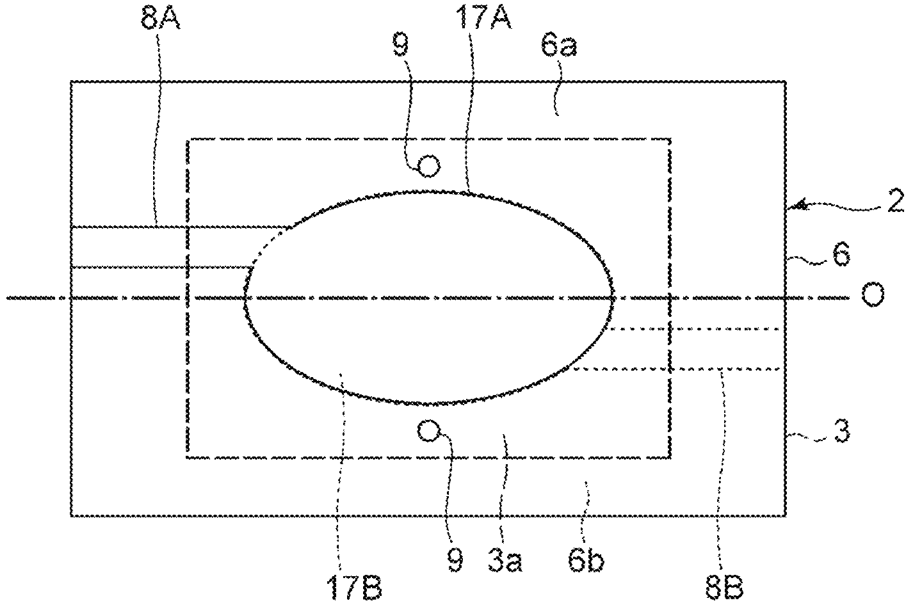
FIG. 5 is a plan view of an acoustic wave device according to a second modification of the first preferred embodiment of the present invention.

On the other hand, in the second modification of the first preferred embodiment illustrated in FIG. 5, the pair of hole portions are line symmetric with respect to each other about the axis of symmetry O. Thus, in the second modification, the pair of hole portions are included the same single group. In the second modification, the number of hole portion groups is one.

In preferred embodiments of the present invention, three or more hole portions may be provided in the piezoelectric layer 6 so as to be included in a plurality of groups. More specifically, a plurality of hole portions each included a group including only one hole portion may be provided, for example. Alternatively, of a plurality of pairs of hole portions, the hole portions in each pair may be included the same group. A fifth preferred embodiment of the present invention shows an example in which a plurality of pairs of hole portions are provided.

Figure 15:
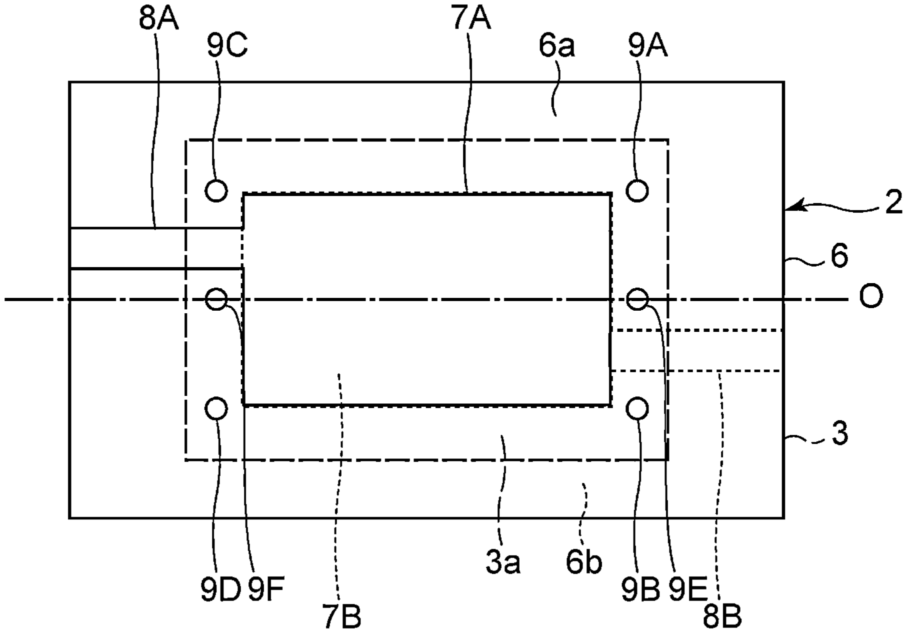
FIG. 15 is a plan view of an acoustic wave device according to a fifth preferred embodiment of the present invention.

FIG. 15 is a plan view of an acoustic wave device according to the fifth preferred embodiment.

The present preferred embodiment differs from the first preferred embodiment in that a plurality of pairs of hole portions are provided in the piezoelectric layer 6 and the number of hole portion groups is different. Other than the above points, the configuration of the acoustic wave device according to the present preferred embodiment is the same as or similar to that of the acoustic wave device 1 according to the first preferred embodiment.

Three pairs of hole portions are provided in the piezoelectric layer 6. Moreover, in the present preferred embodiment, the number of hole portion groups is four, for example. More specifically, the plurality of hole portions are through-holes 9A, 9B, 9C, 9D, 9E, and 9F, as illustrated in FIG. 15.

Of the plurality of through-holes, the through-holes 9A and 9B are paired. The through-holes 9A and 9B are line symmetric about the axis of symmetry O. Thus, the through-holes 9A and 9B are included in the same group. The through-holes 9C and 9D are paired. The through-holes 9C and 9D included in the same group. The through-holes 9E and 9F are paired. Each of the through-holes 9E and 9F is disposed on the axis of symmetry O and has a shape that is line symmetric about the axis of symmetry O. Thus, each of the through-holes 9E and 9F is included in a group including only one through-hole.

The plurality of through-holes in the present preferred embodiment are each included in one of the four different groups. Moreover, the plurality of through-holes are line symmetric about the axis of symmetry O in the respective groups. This improves the evenness of the thermal expansion of the piezoelectric layer 6 when the temperature changes, as in the first preferred embodiment. Accordingly, the piezoelectric layer 6 is resistant to torsional deformation.

Figure 16:
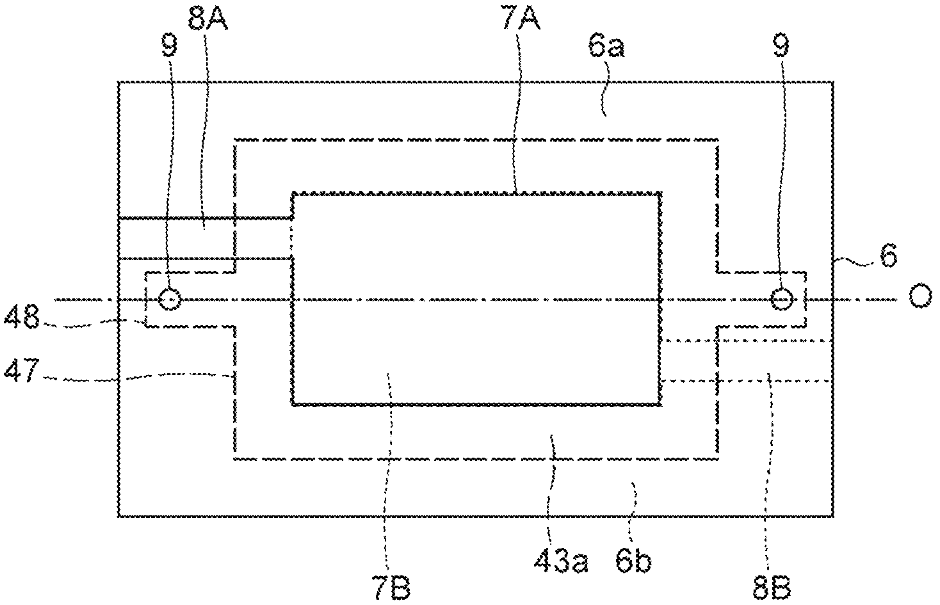
FIG. 16 is a plan view of an acoustic wave device according to a sixth preferred embodiment of the present invention.

FIG. 16 is a plan view of an acoustic wave device according to a sixth preferred embodiment of the present invention.

The present preferred embodiment differs from the first preferred embodiment in the configuration of a cavity portion 43*a* and in the positions of the pair of through-holes 9. Other than the above points, the configuration of the acoustic wave device according to the present preferred embodiment is the same as or similar to that of the acoustic wave device 1 according to the first preferred embodiment.

The cavity portion 43*a* includes a first portion 47 and a second portion 48. More specifically, the first portion 47 is a portion overlapping at least a portion of the first electrode 7A and the second electrode 7B in plan view. The second portion 48 is a portion extending from the first portion 47 in the direction of extension of the axis of symmetry O. In the present preferred embodiment, the cavity portion 43*a* includes two second portions 48. However, it suffices that the cavity portion 43*a* includes at least one second portion 48. In the first preferred embodiment illustrated in FIG. 1, the cavity portion 3*a* is defined by only the first portion 47 illustrated in FIG. 16.

In the present preferred embodiment, the through-holes 9 are provided in portions of the piezoelectric layer 6 overlapping the second portions 48 of the cavity portion 43*a* in plan view. More specifically, of the pair of through-holes 9, one through-hole 9 is provided in a portion overlapping one of the second portions 48 in plan view. The other through-hole 9 is provided in a portion overlapping the other second portion 48 in plan view. Moreover, each through-hole 9 is disposed on the axis of symmetry O and has a shape that is line symmetric about the axis of symmetry O. This improves the evenness of the thermal expansion of the piezoelectric layer 6 when the temperature changes, as in the first preferred embodiment. Accordingly, the piezoelectric layer 6 is resistant to torsional deformation.

Figure 17:
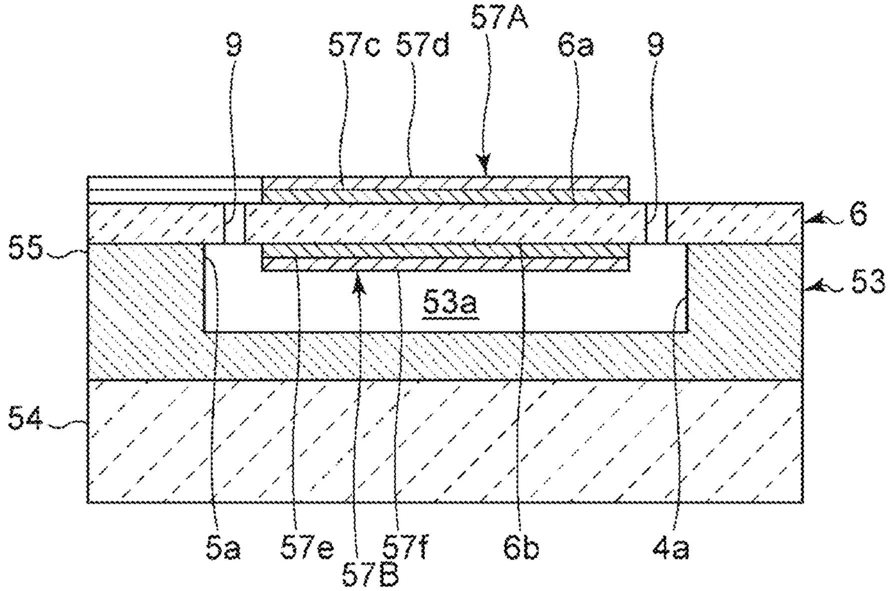
FIG. 17 is an elevational sectional view of an acoustic wave device according to a seventh preferred embodiment of the present invention.

FIG. 17 is an elevational sectional view of an acoustic wave device according to a seventh preferred embodiment of the present invention.

The present preferred embodiment differs from the first preferred embodiment in the configurations of a first electrode 57A, a second electrode 57B, and a cavity portion 53*a*. Other than the above point, the configuration of the acoustic wave device according to the present preferred embodiment is the same as or similar to that of the acoustic wave device 1 according to the first preferred embodiment.

In a support 53, of its support substrate 54 and joint layer 55, only the joint layer 55 includes a recessed portion. In the present preferred embodiment, the recessed portion defines the cavity portion 53*a*. More specifically, the piezoelectric layer 6 is provided on the joint layer 55 so as to cover the recessed portion. In this way, a hollow portion surrounded by the joint layer 55 and the piezoelectric layer 6 is provided. This hollow portion is the cavity portion 53*a*.

As illustrated in FIG. 17, the first electrode 57A and the second electrode 57B are each a multilayer body including a plurality of electrode layers. More specifically, the first electrode 57A includes a first electrode layer 57*c* and a second electrode layer 57*d*. Similarly, the second electrode 57B includes a first electrode layer 57*e* and a second electrode layer 57*f* as well. Of the first electrode layer and the second electrode layer in each of the first electrode 57A and the second electrode 57B, the first electrode layer is positioned on the piezoelectric layer 6 side. The numbers of electrode layers in the first electrode 57A and the second electrode 57B are not particularly limited. For example, the first electrode 57A and the second electrode 57B may include three or more electrode layers. Alternatively, one of the first electrode 57A and the second electrode 57B may include a single electrode layer, as in the first preferred embodiment. In other words, it suffices that at least one of the first electrode 57A or the second electrode 57B is a multilayer body including a plurality of electrode layers.

In the present preferred embodiment, the pair of through-holes are provided in the same or similar manner to those in the first preferred embodiment. This improves the evenness of the thermal expansion of the piezoelectric layer 6 when the temperature changes, and makes the piezoelectric layer 6 resistant to torsional deformation. The configuration of the support 53 or the configurations of the first electrode 57A and the second electrode 57B in the present preferred embodiment may be used in configurations of other preferred embodiments than the present preferred embodiment.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
- a support;
- a piezoelectric layer on the support, with a coefficient of linear expansion that is anisotropic, and including a first main surface and a second main surface opposed to each other, and in which at least one hole is provided;
- a first electrode in or on the first main surface of the piezoelectric layer; and
- a second electrode in or on the second main surface and opposed to the first electrode; wherein
- a cavity is provided in the support;
- at least a portion of the first electrode and the second electrode overlaps the cavity in plan view; and
- in plan view, the at least one hole is line symmetric about an axis of symmetry that passes a center of the cavity in a region where the first electrode and the second electrode overlap each other and that extends in a direction in which the coefficient of linear expansion of the piezoelectric layer is greatest.

2. The acoustic wave device according to claim 1, wherein the at least one hole is provided on the axis of symmetry and has a shape that is line symmetric about the axis of symmetry in plan view.

3. The acoustic wave device according to claim 2, wherein
- the at least one hole includes a pair of holes in the piezoelectric layer;
- shapes and areas of the pair of holes are the same or substantially the same in plan view; and
- the pair of holes are line symmetric about an axis passing the center of the cavity and extending in a direction perpendicular or substantially perpendicular to the axis of symmetry in plan view.

4. The acoustic wave device according to claim 2, wherein
- the at least one hole includes one hole in the piezoelectric layer; and
- the one hole is a through-hole.

5. The acoustic wave device according to claim 1, wherein
- the at least one hole includes a pair of holes in the piezoelectric layer; and
- in plan view, shapes and areas of the pair of holes are the same or substantially the same, and the pair of holes are each provided at a position that is not on the axis of symmetry.

6. The acoustic wave device according to claim 1, wherein the at least one hole is a through-hole.

7. The acoustic wave device according to claim 6, wherein
- the at least one hole includes a pair of holes provided in the piezoelectric layer;
- the acoustic wave device further includes:
  - a first extended wiring line in or on the first main surface of the piezoelectric layer and connected to the first electrode; and
  - a second extended wiring line in or on the second main surface and connected to the second electrode;
- one of the pair of holes passes through the first extended wiring line; and
- another one of the pair of holes passes through the second extended wiring line.

8. The acoustic wave device according to claim 1, wherein the at least one hole is a groove.

9. The acoustic wave device according to claim 8, wherein
- the at least one hole includes a pair of grooves in the piezoelectric layer;
- one of the pair of grooves is provided in the first main surface of the piezoelectric layer; and
- another of the pair of grooves is provided in the second main surface.

10. The acoustic wave device according to claim 8, wherein
- the at least one hole includes a pair of grooves in the piezoelectric layer; and
- both of the pair of grooves are provided in a same one of the first main surface and the second main surface of the piezoelectric layer.

11. The acoustic wave device according to claim 10, wherein
- both of the pair of grooves are provided in the first main surface of the piezoelectric layer; and
- a portion of at least one of the pair of grooves is positioned outside the cavity in plan view.

12. The acoustic wave device according to claim 1, further comprising:
- a dielectric film covering one of the first electrode and the second electrode, the dielectric film being provided in or on one of the first main surface and the second main surface of the piezoelectric layer in or on which the one of the first electrode and the second electrode is provided;
- the at least one hole includes a pair of holes in the piezoelectric layer; and
- at least one of the pair of holes passes through the dielectric film.

13. The acoustic wave device according to claim 1, wherein
- the at least one hole includes a plurality of holes in the piezoelectric layer; and
- when one of the plurality of holes or a pair of the plurality of holes line symmetric about the axis of symmetry are the holes included in one group, and the holes included in different groups are not line symmetric about the axis of symmetry, the plurality of holes are each included in a different one of the groups.

14. The acoustic wave device according to claim 13, wherein
- the plurality of holes include two or more pairs of holes; and
- each of the holes is a through-hole.

15. The acoustic wave device according to claim 1, wherein
- the at least one hole is a through-hole;
- the cavity includes:
  - a first portion overlapping at least a portion of the first electrode and the second electrode in plan view; and
  - a second portion extending from the first portion in a direction of extension of the axis of symmetry; and
- the through-hole is provided in a portion of the piezoelectric layer overlapping the second portion in plan view.

16. The acoustic wave device according to claim 1, wherein the support includes a support substrate and a joint layer provided on the support substrate;

of the support substrate and the joint layer, a recessed portion is provided only in the joint layer;

the piezoelectric layer is provided on the joint layer so as to close the recessed portion;

a hollow portion is surrounded by the joint layer and the piezoelectric layer; and the hollow portion is the cavity.

17. The acoustic wave device according to claim 1, wherein the first electrode and the second electrode are each a multilayer body including a plurality of electrode layers.

* * * * *